US010560073B2

(12) United States Patent
Le Meur et al.

(10) Patent No.: US 10,560,073 B2
(45) Date of Patent: Feb. 11, 2020

(54) METHOD FOR THE NON-LINEAR ESTIMATION OF A MIXTURE OF SIGNALS

(71) Applicant: THALES, Courbevoie (FR)

(72) Inventors: Anne Le Meur, Elancourt (FR); Jean-Yves Delabbaye, Elancourt (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 15/539,386

(22) PCT Filed: Dec. 23, 2015

(86) PCT No.: PCT/EP2015/081213
§ 371 (c)(1),
(2) Date: Jun. 23, 2017

(87) PCT Pub. No.: WO2016/102697
PCT Pub. Date: Jun. 30, 2016

(65) Prior Publication Data
US 2018/0026607 A1 Jan. 25, 2018

(30) Foreign Application Priority Data

Dec. 23, 2014 (FR) ...................................... 14 02981

(51) Int. Cl.
*H03H 17/02* (2006.01)
*G06F 17/18* (2006.01)
(Continued)

(52) U.S. Cl.
CPC ....... *H03H 17/0202* (2013.01); *G06F 17/141* (2013.01); *G06F 17/16* (2013.01);
(Continued)

(58) Field of Classification Search
CPC ........ G06F 17/16; G06F 17/18; G06F 17/153; H03H 17/0213
See application file for complete search history.

(56) References Cited

PUBLICATIONS

D. Kolossa, et al., Research Article, Independent Component Analysis and Time-Frequency Masking for Speech Recognition in Multitalker Conditions, EURASIP Journal on Audio, Speech, and Music Processing, vol. 2010, Article ID 651420, p. 1-13, 2010 (Year: 2010).*
(Continued)

*Primary Examiner* — Andrew Caldwell
*Assistant Examiner* — Emily E Larocque
(74) *Attorney, Agent, or Firm* — B. Aaron Schulman, Esq.; Stite & Harbison, PLLC

(57) ABSTRACT

This method for the non-linear estimation of no more than two mixed signals from separate sources, the time/frequency representation of which shows an unknown non-zero proportion of zero components, using an array made up of P>2 antennas, when the directional vectors U and V of the sources emitting these signals are additionally known or estimated, includes the following steps:
 a) Calculating the successive discrete Fourier transforms of the signal received by the antennas and sampled to obtain a time-frequency P-vector grid of the signal; each element of the grid being referred to as a box and containing a complex vector X forming a measurement;
 b) For each box, calculating the conditional expectation estimator of the signal, or of the signals, from the measurement X and an a priori probability density for the signals that is a Gaussian mixture.

13 Claims, 3 Drawing Sheets

(51) Int. Cl.
G06K 9/62 (2006.01)
G06F 17/14 (2006.01)
G06F 17/16 (2006.01)
G01S 3/74 (2006.01)

(52) U.S. Cl.
CPC ............ *G06F 17/18* (2013.01); *G06K 9/6226* (2013.01); *G06K 9/6244* (2013.01); *H03H 17/0213* (2013.01); *G01S 3/74* (2013.01)

(56) References Cited

PUBLICATIONS

T. Porges, et al., Probability Distribution Mixture Model for Detection of Targets in High-Resolution SAR Images, 2009 International Radar Conference—Surveillance for a Safer World, 2009 (Year: 2009).*

O. Yilmaz, Blind Separation of Speech Mixtures via Time-Frequency Masking, IEEE Transactions on Signal Processing, p. 1-15 2002 (Year: 2002).*

H. Zayyani, et al., Estimating the Mixing Matrix in Sparse Component Analysis (SCA) using EM Algorithm and Iterative Bayesian Clustering, 16th European Signal Processing Conference 2008 (Year: 2008).*

J. Hennessy et al, Computer Architecture, 5th edition, 2012, section 1.3 (Year: 2012).*

Master A S: "Bayesian two source modeling for separation of n sources from stereo signals", Acoustics, Speech, and Signal Processing, 2004. Proceedings.(ICASSP '04). IEEE International Conference on Montreal, Quebec, Canada May 17-21, 2004, Piscataway, NJ, USA,IEEE, Piscataway, NJ, USA, vol. 4, May 17, 2004(May 17, 2004), pp. 281-284, XP010718460, DOI: 10.1109/ICASSP.2004. 1326818 ISBN: 978-0-7803-8484-2 p. 281-p. 283.

Carlos E et al: "ICA Based Blind Source Separation Applied to Radio Surveillance", IEICE Transactions on Communications, Communications Society, Tokyo, JP, vol. E86-B, No. 12, Dec. 2003(Dec. 2003), pp. 3491-3497, XP001191555, ISSN: 0916-8516 the whole document.

C. Fevotte et al: "A Bayesian Approach for Blind Separation of Sparse Sources", IEEE Transactions on Audio, Speech and Language Processing, vol. 14, No. 6, Nov. 2006(Nov. 2006), pp. 2174-2188, XP055224805, New York, NY, USA. ISSN: 1558-7916, DOI: 10.1109/TSA.2005.858523 the whole document.

Zayyani H et al: "Estimating the mixing matrix in Sparse Component Analysis (SCA) using EM algorithm and iterative Bayesian clustering", 2006 14th European Signal Processing Conference, IEEE, Aug. 25, 2008 (Aug. 25, 2008), pp. 1-5, XP032761251, ISSN: 2219-5491 [retrieved on Apr. 3, 2015] the whole document.

International Search Report dated Feb. 29, 2016 in corresponding International Application No. PCT/EP2015/081213.

Written Opinion dated Feb. 29, 2016 in corresponding International Application No. PCT/EP2015/081213.

* cited by examiner

METHOD FOR THE NON-LINEAR ESTIMATION OF A MIXTURE OF SIGNALS

The present invention relates to a method for the non-linear estimation of wireless signals from several sources, the time/frequency representation of which shows an unknown non-zero proportion of zero components, using an array made up of P>2 antennas, when the directional vectors U and V of the sources emitting these signals are additionally known or estimated.

It is commonly necessary to estimate wireless signals (soundproofing) originating from radars, communication systems, or acoustic signals (audio or sonar), and received by a listening system made up of an antenna array.

The received signal results from a temporal and spectral mixture of no more than 2 sources, the directional vectors of which are assumed to be known, since they are estimated beforehand.

The criterion traditionally used is the maximum likelihood (ML), leading to processing by spatial linear filtering, which improves the signal-to-noise ratio by a factor equal to the number of sensors in the single-source case.

In the scenarios being considered (known directional vectors), this processing leads to a nonbiased linear estimate with minimal signal variance for which no a priori knowledge is available.

Other methods that are more complicated to carry out can be used, such as Capon filtering, when the directional vectors are imperfectly or not known ("Robust Adaptive Beamforming", eds P. Stoica and J. Li, Wiley, 2006).

None of these methods exploit any a priori on the signal, and in particular none make it possible to correctly delimit the temporal and/or spectral supports of the signal, since a linear (ML) or pseudo-linear (Capon) processing always provides an output signal, even if at the input, the measurement is only made up of noise.

The problem is to access finer knowledge of the signal.

The invention aims to propose a method enabling a finer determination of the components of the signal.

To that end, the invention relates to a method including the following steps:

a) Calculating the successive discrete Fourier transforms of the signal received by the antennas and sampled to obtain a time-frequency P-vector grid of the signal; each element of the grid being referred to as a box and containing a complex vector X forming a measurement;

b) For each box, calculating the conditional expectation estimator of the signal, or of the signals, from the measurement X and an a priori probability density for the signals that is a Gaussian mixture.

The method thus makes it possible to answer the following questions: for which of the signals present (their number being assumed to be limited to 2 locally), what are the temporal and spectral supports of the supposed signal described by the components obtained using a time/frequency analysis? And, what is the value of each component when it is not zero? The answer to these questions makes it possible to improve the knowledge of the signal.

According to specific embodiments, the method includes one or more of the following features:

said method includes a step for estimating parameters necessary to establish the conditional expectation using the method of moments operating on the boxes of a divided window in the time/frequency grid;

the calculation of the conditional expectation estimator is approximated by a Conditional Expectation with 4 Linear Filters obtained by a four-hypothesis decision processing pertaining to four Hermitian forms of the measurement X, followed by linear filtering commanded by the result of the decision;

the calculation of the Conditional Expectation estimator with 4 Linear Filters is approximated by a Conditional Expectation with Independent Decisions obtained by a two-hypothesis decision processing pertaining to U*X and V*X, followed by linear filtering commanded by the result of the decision;

as a function of the result of the decision, the linear filtering processing yielding the Conditional Expectation estimator with Independent Decisions, is either:

the estimator of the dual-source maximum likelihood for each source;

the single-source maximum likelihood estimator for the first source, 0 for the second source;

0 for the first source, the single-source maximum likelihood estimator for the second source;

0 for each source.

the calculation of the Conditional Expectation estimator with Independent Decisions is approximated by a Thresholded Maximum Likelihood obtained by estimating the signal(s) using the maximum likelihood method followed by the comparison of each estimate to a threshold;

the or each decision threshold is chosen to respect a so-called false alarm likelihood consisting of declaring the signal to be non-zero when it is zero;

said method includes:

A first estimate of the signals done using the Conditional Expectation with Independent Decisions or Thresholded Maximum Likelihood method, An estimate of parameters done from the components of the signal obtained in the previous step, A second estimate of the signals done using the Conditional Expectation method or the Conditional Expectation with 4 Linear Filters method, informed of the values of the parameters obtained in the previous step.

The invention will be better understood upon reading the following description, done in reference to the appended drawings.

Figure 1:
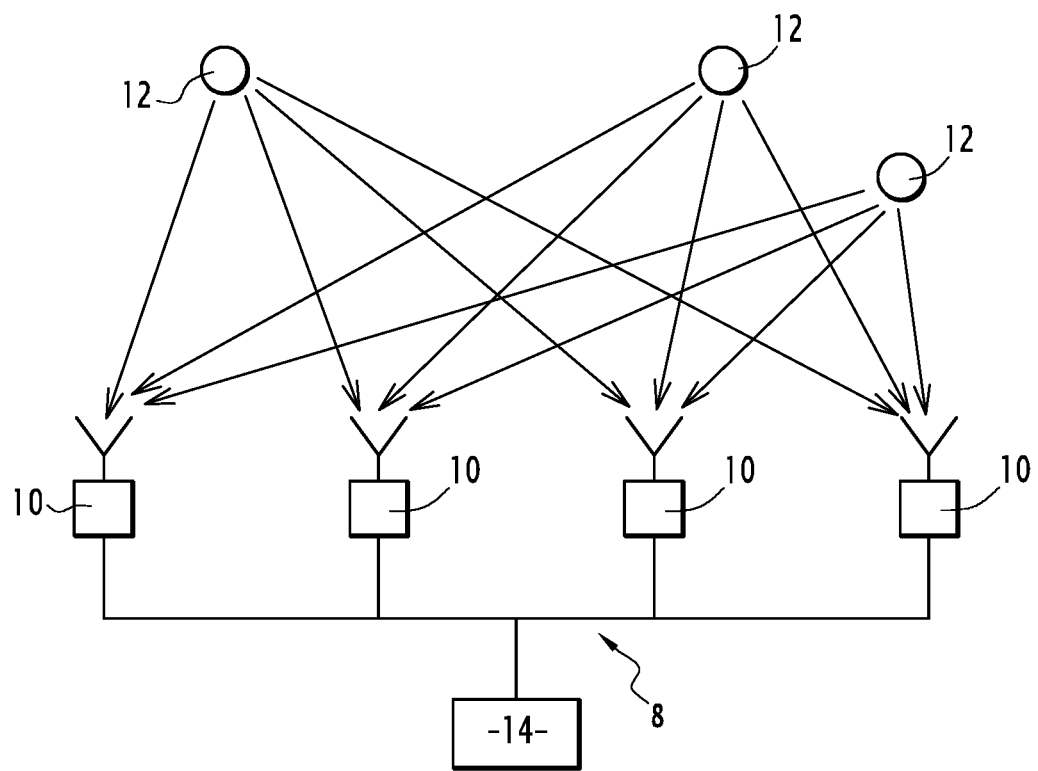
FIG. 1 is a schematic view illustrating signal sources and an installation for estimating wireless signals coming from these sources according to the invention, provided solely for information and not intended to represent reality.

The device 8 for estimating a mixture of signals coming from several sources 12 according to the invention illustrated in FIG. 1 comprises an antenna array made up of a plurality of antenna elements 10 or sensors. Each antenna element is coupled to a receiving channel, in particular to digitize the analog signal received by each sensor.

The invention is suitable both for monopolar antenna arrays and bipolar antenna arrays.

The device further includes computing modules. In different alternative embodiments of the device for estimating signals according to the invention, the computer modules can be arranged with different architectures; in particular, each step of the method can be carried out by a separate module, or on the contrary, all of the steps can be grouped together within a single information processing unit 14.

The computing unit(s) are connected to the sensors by any means suitable for transmitting the received signals.

Figure 2:
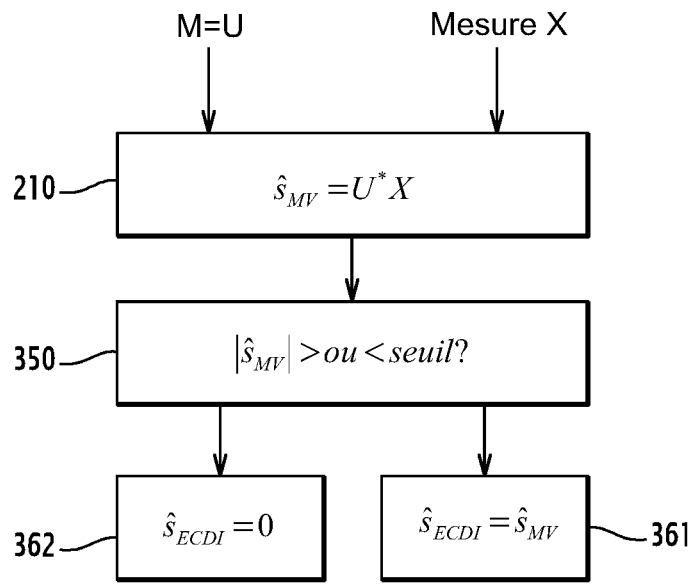
FIG. 2 is a flowchart of one of the methods as implemented in the invention in the single-source case.
Figure 3:
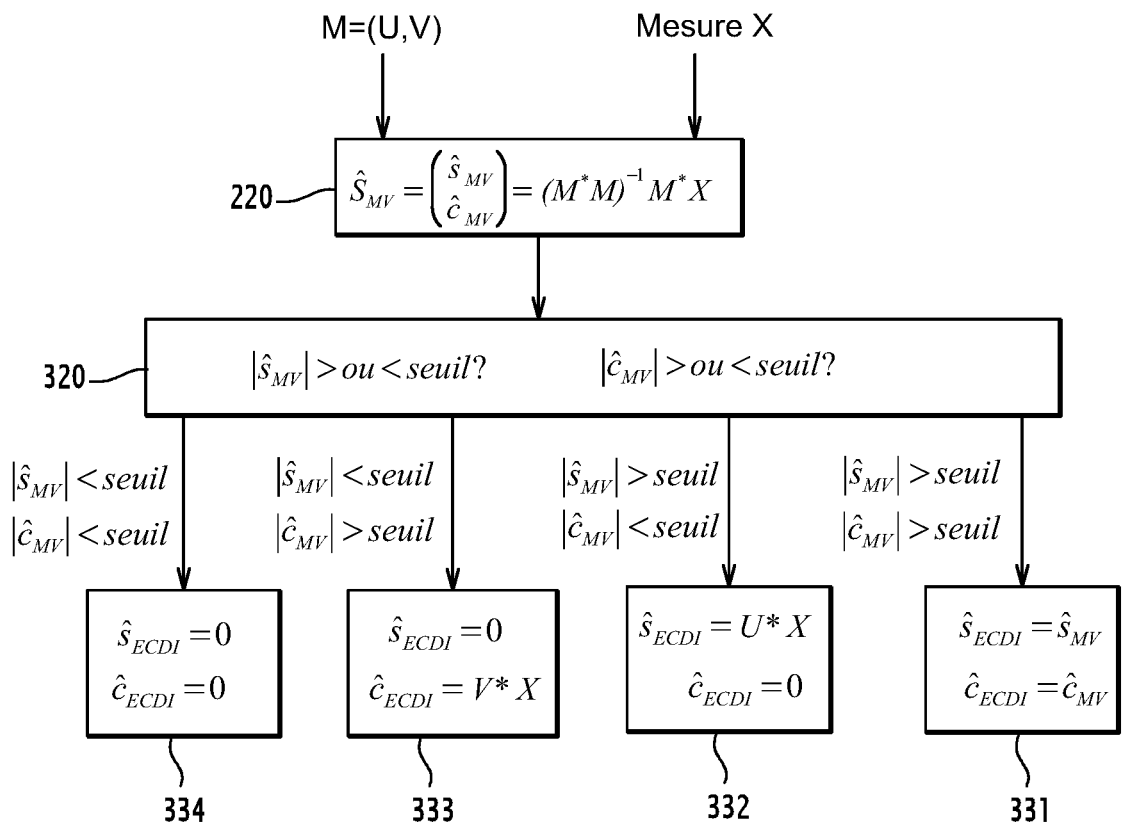
FIG. 3 is a flowchart of one of the methods as implemented in the invention in the dual-source case.
Figure 4:
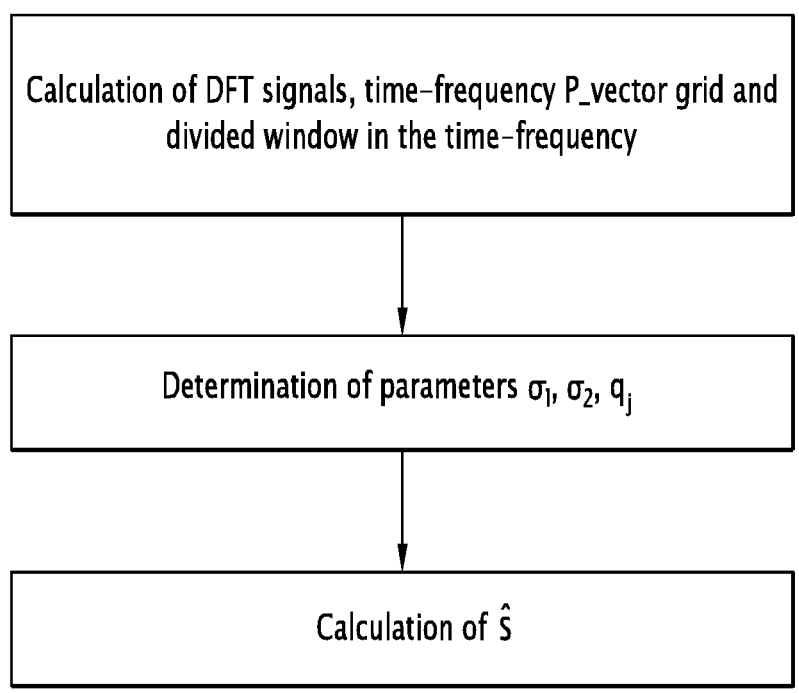
FIG. 4 is a flowchart of one of the methods as implemented in the invention.

The computing unit(s) include information storage means, as well as computing means making it possible to carry out the algorithms of FIGS. 2 and 3, depending on whether a mono-source or dual-source scenario exists.

Advantageously, the reception is done on a spatial diversity array (interferometric array) and the demodulation of the signal allowing the "baseband lowering" is done by the same local oscillator for all of the antennas in order to ensure coherence. The received signal is sampled in real or complex (double demodulation and quadrature or any other method) on each channel.

The received signal, filtered in a band typically of several hundred MHz, is modeled by: $s_0(t)e^{j2\pi f_0 t}$. This model does not provide a hypothesis on the type of modulation.

This signal is sampled at a rhythm Te such that $1/Te \gg 2\times$ band of the wanted signal.

The weighted and overlapping Discrete Fourier Transforms (DFT) of this signal are calculated over $N_{TDF}$ points. The weighting serves to reduce the secondary lobes. Since this weighting causes of variation in the contribution of the data to the DFT (the data at the center of the temporal support of the DFT being assigned a much higher weight than the data on the edges of the support), which can go as far as a loss of the short signals, the hypothesis is used of overlapping of the temporal supports.

The collected measurements are therefore the results of the DFTs. They constitute a time-frequency grid, the boxes of which are called time-frequency boxes. Each box of the grid contains a complex vector that is the result of the Discrete Fourier Transforms for all of the channels, for a given time interval and frequency interval.

For the frequencies of the signals and the distances involved here, the wave front is considered to be planar. The antennas therefore receive the signal with a phase difference depending on the two angles between the wave plane and the plane of the antennas.

In the mono-phase case, the measurements collected on the complete network are therefore written as follows:

$$X_n = s_n U + W_n$$

$X_n$ represents the measurements: $X_n$ is a complex column vector with dimension P, where P is the number of channels and n=1, 2, . . . N is a double index (l,c) traveling the space of the times (index of the Fourier transform) and frequencies (channel number for a Fourier transform). More specifically, the index n travels the boxes of a temporal x frequency rectangular window with size N. The indices l and c correspond to the row and column numbers of the boxes of the window.

$s_n$ is a complex number representing the signal after DFT.

$W_n$ is the thermal noise in the time/frequency box with index n. $W_n$ is a column vector with dimension P. $W_n$ is Gaussian over its real and imaginary components, independent from one time/frequency box to the other and independent from one antenna channel to the other. In other words, $W_n$ is spatially, frequentially and temporally blank. The standard deviation of the noise counted on each real or imaginary component, at a time/frequency box, is equal to $\sigma$. For the hypothesis of independence of the noise from one box to the next be verified, the overlap of the DFTs is limited to 50%.

In the case of a monopolar interferometric array, U is written as follows:

$$U = g \begin{pmatrix} u_1 \\ \dots \\ u_P \end{pmatrix},$$

where g is a complex scalar dependent on the polarization of the incident wave and its arrival direction, and where $u_i$ are modulus 1 complex numbers representing the geometric phase shifts associated with the direction of the incident wave. It is possible to choose one of the antennas of the receiver as phase reference.

In the case of a $interferometric array, U is written as follows:

$$U = hH + vV,$$

where h and v are complex scalars such as $|h|^2 + |v|^2 = 1$ that express the polarization of the incident wave, and where H (V, resp.) is the response from the array to a horizontally (vertically, resp.) polarized wave. H and V only depend on the direction and frequency of the incident wave.

In all cases, U is of dimension P, where P is the number of antennas used.

It is possible to consider that U is standardized, and that $s_n$ carries the power of the signal and the mean gain of the array.

U is kept by the DFT, which is a linear transform, and is found on the signal output by the DFT.

In the general scenario, it is possible to have a mixture of K signals (K optionally being greater than the resolution of the array). The signal is then written:

$$X_n = \sum_{k=1}^{N} s_k(n) U_k + W_n; n = 1, 2, \dots N \qquad \text{Equation 1}$$

Expression of a signal mixture

The fundamental hypothesis is that when the set of N time/frequency boxes is restricted to a rectangular zone or window with index j, the complexity of the environment is such that in such a window, the mixture of the signals is limited to two signals.

The model then becomes:

$$X_{jn} = s_{j1}(n) U_{j1} + s_{j2}(n) U_{j2} + W_n \qquad \text{Equation 2}$$

Expression of a Signal Mixture in a Window

Windows of predetermined size are defined to cover the time-frequency grid. All of these windows form a division of the grid. The size of the windows is chosen such that no more than two signals from two sources are present in each window.

The vector U or the vectors U and V designating the unitary directional vector(s) formed by the incident signal(s) relative to the array are next extracted (or estimated), using any suitable known means.

A loop is formed to travel all of the windows defining the division of the grid.

For each window, a step for estimating the signal(s) is carried out using the conditional expectation and approximations that can be made thereto for the specific model of the signals.

The final processing is broken down into:
- a nonlinear decision step of the situation in each time/frequency box: source 1 present and source 2 present, or: source 1 present and source 2 absent, or: source 1 absent and source 2 present, or source 1 absent and source 2 absent, then
- a linear filtering step specific to the situation.

The obtained processing is nonbiased, practically optimal within the meaning of the mean quadratic error, and provides a time/frequency delimitation of the support of the signal to be estimated.

The estimate of the signal is done over a window where the situation is mono-source or dual-source.

In a mono-source situation, the vectorial signal measured for the box with index n is $$X_n = s_n U + W_n, \quad n=1, 2, \ldots \qquad \text{Equation 3}$$

Expression of the Measured Signal (Mono-Source Scenario)

In a dual-source situation, one has:

$$X_n = s_n U + c_n V + W_n, \quad n=1, 2, \ldots \qquad \text{Equation 4}$$

Expression of the Measured Signal (Dual-Source Scenario)

In the writings of Equation 3 and Equation 4, U and V are unitary directional vectors of a monopolar or bipolar array, $s_n$ and $c_n$ are complex signals that must be estimated; $W_n$ is the noise, which is spatially white and in n, Gaussian, centered and with covariance: $E(W_n W_n^*) = 2\sigma^2 I_P$ where $I_P$ is the unit matrix of $C^P$ (P being the number of receiving channels). * designates the conjugated transpose.

Hereinafter, it will be assumed that U and V are estimated by $\hat{U}$ and $\hat{V}$, for example using a method of the MUSIC type, and that this estimate having been done over a number of boxes N>>1, it is possible to make the approximation $U=\hat{U}$, $V=\hat{V}$.

To account for the fact that $s_n$ (or $c_n$) can be zero for certain n, without knowing the modulation of the signal in advance, $s_n$ (or $c_n$) is modeled as independent samples in n of a random variable whereof the probability density is a mixture (q, 1−q, 1<1) of two Gaussians centered on respective variances $2\sigma_j^2$ (j=1 for $s_n$ and j=2 for $c_n$), and $2\tau^2$, with $\tau^2 < \sigma_2^2 < \sigma_1^2$.

$2\sigma_j^2$ is the power of the wanted signal if it is present when $\tau^2$ is neglected in the expression $(1-q)2\tau^2 + q2\sigma_j^2$ of the mean power.

$\tau$ is a regularization parameter of the model that makes it possible to apply the Bayes formula for laws of probability allowing probability densities relative to the Lebesgue measurement; however, the physical reality is that there is no signal when this is modeled using the variance-centered Gaussian $2\tau^2$ (power $2\tau^2$). That is why, at the end of the calculations, only the limit of the expressions is retained when $\tau \to 0$.

$S_n$ and $c_n$ are considered to be independent.

In both cases, mono-source or dual-source, the measured signal is written in the single form:

$$X_n = M S_n + W_n, \quad n=1, 2, \ldots N \qquad \text{Equation 5}$$

Metrical Form of the Measured Signal where $M=U$ and $S_n=s_n$ in mono-source, and $M=(U\ V)$, $S_n=(s_n\ c_n)^T$ in dual-source, with M known and $\sigma^2$ known.

In the rest of the document, to make the notations lighter, with the understanding that the processing is done on each box with index n independently, the index n is omitted and X denotes the measurement in a time/frequency box, s the mono-source signal and $S=(s\ c)^T$ the dual-source signal in a time/frequency box.

The a priori knowledge of S is given by a probability density. In the mono-source case:

$$p(s) = \frac{q}{2\pi\sigma_1^2} \exp\left(-\frac{|s|^2}{2\sigma_1^2}\right) + \frac{1-q}{2\pi\tau^2} \exp\left(-\frac{|s|^2}{2\tau^2}\right) \qquad \text{Equation 6}$$

Probability density of the signal (mono-source case)

In the dual-source case:

$$p(S) = \sum_j \frac{q_j}{\pi^2 \det C_j} \exp(-S^* C_j^{-1} S) \qquad \text{Equation 7}$$

Probability density of the signal (dual-source case)

where $q_1 = q^2, q_2 = q_3 = q(1-q), q_4 = (1-q)^2$ if the sources are considered to be independent and equally probable (hereinafter, we generalize to a distribution $q_1, q_2, q_3, q_4$ of 4 situations not connected by the above expressions), And $$C_1 = \begin{pmatrix} 2\sigma_1^2 & 0 \\ 0 & 2\sigma_2^2 \end{pmatrix}, C_2 = \begin{pmatrix} 2\sigma_1^2 & 0 \\ 0 & 2\tau^2 \end{pmatrix}, \qquad \text{Equation 8}$$

$$C_3 = \begin{pmatrix} 2\tau^2 & 0 \\ 0 & 2\sigma_2^2 \end{pmatrix}, C_4 = \begin{pmatrix} 2\tau^2 & 0 \\ 0 & 2\tau^2 \end{pmatrix}$$

Covariance matrices of the signal are the covariance matrices of S for the four possible cases.

S is estimated using the conditional expectation by using the mono-source and dual-source models (Equation 5, Equation 6 and Equation 5, Equation 7).

The Conditional Expectation (CE) is the estimator $\hat{S}$ that minimizes the mean quadratic deviation $E(\|S-\hat{S}\|^2)$. It is also nonbiased, and provides an explicit solution for S. It is built as follows:

Let X be the measurement; its probability density, which depends on the parameter to be estimated S, is interpreted as the conditional probability density of X knowing S. One therefore has p(X/S) and p(S) derived from the a priori knowledge of S.

$\hat{S}$ is given by the explicit formula:

$$\hat{S} = \int_{domS} S p(S/X) dS \qquad \text{Equation 9}$$

Estimate of S p(S/X), the conditional probability of S knowing X, is obtained by the Bayes formula.

$$p(S/X) = \frac{p(X/S) \cdot p(S)}{p(X)} \qquad \text{Equation 10}$$

General writing of the conditional probability of S knowing X $$\text{With } p(X) = \int_{domS} p(X/S) \cdot p(S) dS \qquad \text{Equation 11}$$

General writing of the probability density of X

In the case where X=MS+V and p(S) is Gaussian, covariance-centered C, it is possible to find $\hat{S}$ analytically, which is generally not the case.

This is a linear function of X. In fact (in dimensions 2):

$$p(X/S) = \frac{1}{\pi^2 4\sigma^4} \exp\left(-\frac{\|X - MS\|^2}{2\sigma^2}\right)$$

$$p(S) = \frac{1}{\pi^2 \det C} \exp(-S^* C^{-1} S)$$

$$p(X/S)p(S) =$$
$$\frac{1}{\pi^4 4\sigma^4 \det C} \exp\left(-\frac{\|X\|^2}{\|2\sigma^2\|} + \frac{X^* MS}{2\sigma^2} + \frac{S^* M^* X}{2\sigma^2} - \frac{S^* M^* MS}{2\sigma^2} - S^* C^{-1} S\right)$$

Let us take $$\sum\nolimits^{-1} = \frac{M^* M}{2\sigma^2} + C^{-1}$$

By completing the "square" in S, we have:

$$p(X/S)p(S) = \frac{K_2}{\det C} \exp\left(-\left(S - \frac{\sum}{2\sigma^2} M^* X\right)^* \sum\nolimits^{-1} \left(S - \frac{\sum}{2\sigma^2} M^* X\right) - \frac{\|X\|^2}{2\sigma^2} + \frac{X^* M \sum M^* X}{4\sigma^4}\right)$$

where $K_2$ is a constant ($=1/\pi^4 4\sigma^4$) in dimension 2. $\Sigma$ is a Hermitian matrix defined positive. One deduces from this:

$$\int_{domS} p(X/S)p(S) \, dS = \qquad \text{Equation 12}$$
$$\frac{K_2 \pi^2 \det \sum}{\det C} \exp\left(-\frac{\|X\|^2}{2\sigma^2} + \frac{X^* M \sum M^* X}{4\sigma^4}\right)$$

Probability density of measurements in dual-source $$\int_{domS} S \cdot p(X/S)p(S) \, dS = \frac{K_2 \pi^2 \det \sum}{\det C} \qquad \text{Equation 13}$$
$$\exp\left(-\frac{\|X\|^2}{2\sigma^2} + \frac{X^* M \sum M^* X}{4\sigma^4}\right) \cdot \frac{\sum}{2\sigma^2} M^* X$$

Conditional probability density of $S$ knowing $X$ in dual-source

The complete expressions of Equation 12 will be used to find the desired estimator for our problem.

In the case where S is a Gaussian sample, Equation 9, Equation 10, Equation 11, Equation 12 and Equation 13 yield:

$$\hat{S} = \frac{\sum}{2\sigma^2} M^* X \qquad \text{Equation 14}$$

Estimate of $S$ in dual-source
(case where $S$ is Gaussian)

which can also be written:

$$\hat{S} = (2\sigma^2 \Sigma^{-1})^{-1} M^* X = (M^* M + 2\sigma^2 C^{-1})^{-1} M^* X$$

One concludes from this that if $2\sigma^2 C^{-1} \ll M^* M$, $\hat{S}$ is reduced to the maximum likelihood estimator of S using the model of Equation 5 with no a priori knowledge of S: $\hat{S}_{MV} = (M^* M)^{-1} M^* X$.

The condition $2\sigma^2 C^{-1} \ll M^* M$ as matrices is also expressed by $C \gg 2\sigma^2 (M^* M)^{-1}$, which means that the a priori on S that is defined by C does not provide real information on S.

The estimate of the signal in the mono-source case is as indicated below.

In the one-dimensional case for S=s (mono-source), M=U, and therefore $M^* M = 1$;

The matrix C is reduced to the constant c;

$$p(X/S)p(S) = \frac{1}{2\pi\sigma^2} \exp\left(-\frac{\|X - Us\|^2}{2\sigma^2}\right);$$

$$p(s) = \frac{1}{\pi \cdot c} \exp\left(-\frac{|s|^2}{c}\right)$$

$$\sum\nolimits^{-1} = \frac{1}{2\sigma^2} + \frac{1}{c} \text{ or } \sum = \frac{2\sigma^2 c}{2\sigma^2 + c}$$

is deduced from this $$p(X/S)p(S) =$$
$$\frac{K_1}{c} \exp\left(-\frac{2\sigma^2 + c}{2\sigma^2 c}\left|1 - \frac{c}{2\sigma^2 + c} U^* X\right|^2 - \frac{\|X\|^2}{2\sigma^2} + \frac{c}{2\sigma^2(2\sigma^2 + c)}|U^* X|^2\right)$$

with $K_1 = \frac{1}{2\pi\sigma^2}$

This then yields:

$$\int_{doms} s \cdot p(X/S) \cdot p(S) = \frac{K_1}{c} \pi \frac{2\sigma^2 c}{2\sigma^2 + c} \qquad \text{Equation 15}$$
$$\exp\left(-\frac{\|X\|^2}{2\sigma^2} + \frac{c}{2\sigma^2(2\sigma^2 + c)}|U^* X|^2\right) \cdot \frac{c}{2\sigma^2 + c} U^* X$$

Conditional probability density of $S$ knowing $X$ in mono-source $$\int_{doms} p(X/S)p(S) = \qquad \text{Equation 16}$$
$$\frac{K_1}{c} \pi \frac{2\sigma^2 c}{2\sigma^2 + c} \exp\left(-\frac{\|X\|^2}{2\sigma^2} + \frac{c}{2\sigma^2(2\sigma^2 + c)}|U^* X|^2\right)$$

Probability density of measurements in mono-source

The conditional expectation is obtained, in the Gaussian case for s, by the quotient of Equation 15 by Equation 16:

$$\hat{s} = \frac{c}{2\sigma^2 + c} U^* X \qquad \text{Equation 17}$$

Estimate of $s$ in *mono*-source (case where $s$ is Gaussian)

If $c \gg 2\sigma^2$, which expresses that one has no a priori information on s, $\hat{s}$ is reduced to the maximum likelihood estimator. $\hat{s}_{MV} = U^* X$.

The estimate of the signal in the dual-source case is as indicated below.

The conditional expectation estimator is obtained using Equation 15 and Equation 16 for the mixture density of S given by Equation 7.

After simplifying by the common factor $$K_2 \pi^2 \exp\left(-\frac{\|X\|^2}{2\sigma^2}\right)$$

in all of the terms in the numerator and the denominator, one obtains:

Equation 18

$$\hat{S} = \frac{\sum_j q_j \frac{\det \Sigma_j}{\det C_j} \exp\left(\frac{1}{4\sigma^4} X^* M \Sigma_j M^* X\right) \frac{\Sigma_j}{2\sigma^2} M^* X}{\sum_j q_j \frac{\det \Sigma_j}{\det C_j} \exp\left(\frac{1}{4\sigma^4} X^* M \Sigma_j M^* X\right)}$$

Condition expectation in dual-source

With $\Sigma_j^{-1} = \frac{M^*M}{2\sigma^2} + C_j^{-1}$ or $\Sigma_j = 2\sigma^2(M^*M + 2\sigma^2 C_j^{-1})^{-1}$ Let us take $\Gamma_j = 2\sigma^2 C_j^{-1}$ (without dimension), $Q_j = (M^*M + 2\sigma^2 C_j^{-1})^{-1} = (M^*M + \Gamma_j)^{-1} = \Sigma_j / 2\sigma^2$ We have:

Equation 19

$$\hat{S} = \frac{\sum_{j=1}^{4} q_j \det Q_j \det \Gamma_j \exp\left(\frac{X^* M Q_j M^* X}{2\sigma^2}\right) Q_j M^* X}{\sum_{j=1}^{4} q_j \det Q_j \det \Gamma_j \exp\left(\frac{X^* M Q_j M^* X}{2\sigma^2}\right)}$$

Conditional expectation in dual − source

According to Equation 8, $$M^*M = \begin{pmatrix} 1 & U^*V \\ V^*U & 1 \end{pmatrix}$$

$$\Gamma_1 = \begin{pmatrix} \sigma^2/\sigma_1^2 & 0 \\ 0 & \sigma^2/\sigma_2^2 \end{pmatrix},$$

$$Q_1^{-1} = \begin{pmatrix} 1+\sigma^2/\sigma_1^2 & U^*V \\ V^*U & 1+\sigma^2/\sigma_2^2 \end{pmatrix}$$

$$\Gamma_2 = \begin{pmatrix} \sigma^2/\sigma_1^2 & 0 \\ 0 & \sigma^2/\tau^2 \end{pmatrix},$$

$$Q_2^{-1} = \begin{pmatrix} 1+\sigma^2/\sigma_1^2 & U^*V \\ V^*U & 1+\sigma^2/\tau^2 \end{pmatrix}$$

$$\Gamma_3 = \begin{pmatrix} \sigma^2/\tau^2 & 0 \\ 0 & \sigma^2/\sigma_2^2 \end{pmatrix},$$

$$Q_3^{-1} = \begin{pmatrix} 1+\sigma^2/\tau^2 & U^*V \\ V^*U & 1+\sigma^2/\sigma_2^2 \end{pmatrix}$$

$$\Gamma_4 = \begin{pmatrix} \sigma^2/\tau^2 & 0 \\ 0 & \sigma^2/\tau^2 \end{pmatrix},$$

-continued $$Q_4^{-1} = \begin{pmatrix} 1+\sigma^2/\tau^2 & U^*V \\ V^*U & 1+\sigma^2/\tau^2 \end{pmatrix}$$

One deduces from this:

$Q_1 =$ Equation 20

$$\frac{1}{(1+\sigma^2/\sigma_1^2)(1+\sigma^2/\sigma_2^2) - |U^*V|^2} \begin{pmatrix} 1+\sigma^2/\sigma_2^2 & -U^*V \\ -V^*U & 1+\sigma^2/\sigma_1^2 \end{pmatrix}$$

$$Q_2 = \frac{1}{(1+\sigma^2/\sigma_1^2)(1+\sigma^2/\tau^2) - |U^*V|^2} \begin{pmatrix} 1+\sigma^2/\tau^2 & -U^*V \\ -V^*U & 1+\sigma^2/\sigma_1^2 \end{pmatrix}$$

$$Q_3 = \frac{1}{(1+\sigma^2/\tau^2)(1+\sigma^2/\sigma_2^2) - |U^*V|^2} \begin{pmatrix} 1+\sigma^2/\sigma_2^2 & -U^*V \\ -V^*U & 1+\sigma^2/\tau^2 \end{pmatrix}$$

$$Q_4 = \frac{1}{(1+\sigma^2/\tau^2)^2 - |U^*V|^2} \begin{pmatrix} 1+\sigma^2/\tau^2 & -U^*V \\ -V^*U & 1+\sigma^2/\tau^2 \end{pmatrix}$$

$Qi$ matrices

The expression of the estimate of the signal is subject to an approximation to allow it to be estimated as indicated below in the dual-source case.

The products of determinants in Equation 19 are respectively equal to the following expressions, an approximation of which is provided for a good signal-to-noise ratio ($\sigma_1^2/\sigma^2 \gg 1$ and $\sigma_2^2/\sigma^2 \gg 1$) and for $\tau \to 0$.

$\det Q_1 \det \Gamma_1 = [(1+\sigma^2/\sigma_1^2)(1+\sigma^2/\sigma_2^2) - |U^*V|^2]^{-1} \sigma^4/\sigma_1^2 \sigma_2^2 \approx (1-|U^*V|^2)^{-1} \sigma^4/\sigma_1^2 \sigma_2^2$ $\det Q_2 \det \Gamma_2 = [(1+\sigma^2/\sigma_1^2)(1+\sigma^2/\tau^2) - |U^*V|^2]^{-1} \sigma^4/\sigma_1^2 \tau^2 \approx (\tau^2/\sigma^2)(1+\sigma^2/\sigma_1^2)^{-1} \cdot (\sigma^4/\sigma_1^2 \tau^2) \approx \sigma^2/\sigma_1^2$ $\det Q_3 \det \Gamma_3 = [(1+\sigma^2/\tau^2)(1+\sigma^2/\sigma_2^2) - |U^*V|^2]^{-1} \sigma^4/\sigma_2^2 \tau^2 \approx \sigma^2/\sigma_2^2$ $\det Q_4 \det \Gamma_4 = [(1+\sigma^2/\tau^2)^2 - |U^*V|^2]^{-1} \sigma^4/\tau^4 \approx 1$ Equation 21

Det $Q_i$ det $\Gamma_i$

Likewise, one finds, for $Q_j$ when $\tau \to 0$:

$Q_1$ is unchanged.

$$Q_1 \approx \frac{1}{(1+\sigma^2/\sigma_1^2)(1+\sigma^2/\sigma_2^2) - |U^*V|^2} \begin{pmatrix} 1 & -U^*V \\ -V^*U & 1 \end{pmatrix}$$ Equation 22

$$Q_2 \approx \begin{pmatrix} 1/(1+\sigma^2/\sigma_1^2) & 0 \\ 0 & 0 \end{pmatrix}$$

$$Q_3 \approx \begin{pmatrix} 0 & 0 \\ 0 & 1/(1+\sigma^2/\sigma_2^2) \end{pmatrix}$$

$$Q_4 \approx \begin{pmatrix} 0 & 0 \\ 0 & 0 \end{pmatrix}$$

Simplified form of the $Qi$ matrices

One can see that the products det $Q_i$ det $\Gamma_i$ have a finite limit in each of the four situations, as do the matrices $Q_j$, which is a satisfactory behavior.

One has thus obtained a first expression of the estimator.
In reality, only one of the terms in Equation 19 is preponderant for each box, which leads to a first simplification. The new estimating processing of the $\hat{S}$ is deduced from this.
$\hat{S}=Q_{j0}M^*X$ where $$j_0 = \text{ArgMax}_j\{q_j \det Q_j \det \Gamma_j \exp(X^*MQ_jM^*X/2\sigma^2)\}$$

Which is simplified as:

$$\hat{S} = Q_{j0}M^*X \quad \text{Equation 23}$$

where $$j_0 = \text{ArgMax}_j F_j = \text{ArgMax}_j$$

$$\{\ln(q_j \det Q_j \det \Gamma_j) + X^*MQ_jM^*X/2\sigma^2\}$$

Estimate of the signal with decision function

M*X is given by:

$$M^*X = \begin{pmatrix} U^*X \\ V^*X \end{pmatrix}$$

The det $Q_j$·det $\Gamma_j$ are given by Equation 21.
The $Q_j$ are given by Equation 22.
The $q_j$ are for example given by $$q_j = \begin{cases} q^2, j=1 \\ q(1-q), j=2,3 \\ (1-q)^2, j=4 \end{cases} \quad \text{Equation 24}$$

Expression of the $q_i$ parameters if there is independence of the 4 situations and equal probability for s≠0,c≠0.
F(j) is given by:

$$F(j_1)=\ln(q_1 \det Q_1 \det \Gamma_1)+X^*MQ_1M^*X/2\sigma^2=$$
$$\ln(q^2(1-|U^*V|^2)\sigma^4/\sigma_1^2\sigma_2^2)+X^*MQ_1M^*X/2\sigma^2$$

$$F(j_2)=\ln(q_2 \det Q_2 \det \Gamma_2)+X^*MQ_2M^*X/2\sigma^2=$$
$$\ln(q(1-q)\sigma^2/\sigma_1^2)+X^*UU^*X/2\sigma^2$$

$$F(j_3)=\ln(q_3 \det Q_3 \det \Gamma_3)+X^*MQ_3M^*X/2\sigma^2=$$
$$\ln(q(1-q)\sigma^2/\sigma_2^2)+X^*VV^*X/2\sigma^2$$

$$F(j_4)=\ln(q_4 \det Q_4 \det \Gamma_4)+X^*MQ_4M^*X/2\sigma^2=$$
$$\ln((1-q)^2)$$

For $j_0=1$, the maximum likelihood estimator is found. Indeed, in this case, $$\Gamma_1 = \begin{pmatrix} \sigma^2/\sigma_1^2 & 0 \\ 0 & \sigma^2/\sigma_2^2 \end{pmatrix} \approx 0$$

and $Q_1=(M^*M)^{-1}$ such that $\overline{S}=(M^*M)^{-1}M^*X$. One can see that if $U^*V=0$, then the estimates of s and c are completely separate, since then, the relationship $\hat{S}=(M^*M)^{-1}M^*X$ is simplified and uncoupled into $\hat{s}=U^*X$, $\hat{c}=V^*X$.

For $j_0=2, \hat{S}^T=(U^*X,0)$ (filtering by the directional vector of source 1).

For $j_0=3, \hat{S}^T=(0,V^*X)$ (filtering by the directional vector of source 2).

For $j_0=4, \hat{S}^T=(0,0)$

Where the symbol $^T$ designates the transpose.

One has thus "linearized" the optimal processing, since one has obtained four linear filters, controlled by the decision on the type of situation for each box: both sources are present/source 1 is present/source 2 is present/neither of the sources is present. The obtained estimator is called "Conditional Expectation with 4 Linear Filters".

In this way, we have simplified the optimal estimator, by breaking it down into two steps:
Detection of the situation
Application of filtering appropriate to the situation
It is satisfactory to see that the estimator is independent of τ, which is the expected behavior, since τ is not a physical parameter, but an artifice making it possible to modify the "absence of signal" situation by a very tight Gaussians.

This estimator requires the calculation of three quadratic forms and a test. The difficulty remains calculating the unknown parameters $q_{j,j=1...4}$, $\sigma_1^2$, $\sigma_2^2$ (the power of the noise $2\sigma^2$ is presumed to be known).

In the specific case where the 2 sources are independent, and have the same power and the same presence rate, the parameters can be estimated by calculating the empirical moments of order 2 and 4.

If we call $2\sigma'^2$ the shared value of the variance of the Gaussian representing each source, and q the probability shared by the 2 sources, everything happens as if we were in a mono-source situation, with a single source of variance $2\sigma_M'^2=2\sigma'^2$ and presence probability $q_M=2q$.

$\sigma_M'^2$ and $q_M$ are then given by the following equations:

$$\begin{cases} \frac{1}{N}\sum_n |X_n|^2 = 2q_M\left(\frac{\sigma_M'^2}{P}+\sigma^2\right)+(1-q_M)2\sigma^2 \\ \frac{1}{N}\sum_n |X_n|^4 = 8q_M\left(\frac{\sigma_M'^2}{P}+\sigma^2\right)^2+8(1-q_M)\sigma^4 \end{cases}$$

In the general case (independent sources), there are 4 parameters of the model: $q_1$, $q_2$, $\sigma_1^2$, $\sigma_2^2$. One skilled in the art knows how to generalize the method of moments above to higher orders to obtain the estimates of these parameters.

An alternative of the estimating processing consists of simplifying the decision step previously described, as follows:

The conditional expectation considers all four possible situations:

s≠0,c≠0;s≠0,c=0;s=0,c≠0;s=0,c=0

It is normally necessary to address a decision problem with four hypotheses.

To simplify, we propose to test s≠0 against s=0 independently of c on the one hand, and to test c≠0 against c=0 independently of s on the other hand. We therefore perform two tests with two hypotheses instead of one test with four hypotheses.
These tests will be done from preprocessed measurements U*X, V*X.
Test of s≠0 Against s=0

$$H_1:\begin{cases} U^*X = s + U^*V\cdot c + u \\ V^*X = V^*U\cdot s + c + v \end{cases}, s \neq 0 \quad \text{Equation 25}$$

$$H_0:\begin{cases} U^*X = U^*V\cdot c + u \\ V^*X = c + v \end{cases}, s \neq 0$$

Simplified hypothesis test:

the 2 hypotheses for s
where the (.) indicate the scalar x scalar product and where $u=U^*W, v=V^*W:(u,v)$ is therefore Gaussian, centered and with covariance:

$$E\left\{\begin{pmatrix}U^*W\\V^*W\end{pmatrix}(W^*U \quad W^*V)\right\} = 2\sigma^2\begin{pmatrix}1 & U^*V\\V^*U & 1\end{pmatrix},$$

and where c is an unknown parameter.

It is a problem not varying by the group of sector translations $(U^*V\ 1)^T$ and a linear hypothesis problem (see "Testing Statistical Hypothesis", $3^{rd}$ edition, E. L. Lehmann, J. P. Dominos, Springer, 2005). It may be processed by first performing a projection on the orthogonal of $(U^*V\ 1)^T$ to eliminate c, then testing the presence of s using the chi2 test. The projection is written:

$$U^*X - (U^*V)V^*X = \begin{cases}(1-|U^*V|^2)s + u - (U^*V)v & (H_1)\\ u - (U^*V)v & (H_0)\end{cases}$$

The test to be performed therefore pertains to the measurement $|U^*X-(U^*V)V^*X|^2$:

$$|U^*X-(U^*V)V^*X|^2 > ou < \lambda \qquad \text{Equation 26}$$

Simplified hypothesis test on s

Which amounts to the same thing as performing the test:

$$|\hat{s}_{MV}|^2 = \frac{|U^*X - (U^*V)V^*X|^2}{(1-|U^*V|^2)} > ou < \lambda',$$

where $\hat{s}_{MV}$ is the estimate within the meaning of the maximum likelihood of s.

Test of $c \ne 0$ Against $c=0$

In the same way for c, $M^*X$ is projected on the orthogonal of $(1\ V^*U)^T$ in order to eliminate the terms in s, and the new measurement to be considered is obtained:

$$-(V^*U)U^*X + V^*X = \begin{cases}(1-|U^*V|^2)c + v - (V^*U)u & (H'_1)\\ v - (V^*U)u & (H'_0)\end{cases}$$

One obtains the following test:

$$|(V^*U)U^*X-V^*X|^2 > ou < \mu \qquad \text{Equation 27}$$

Simplified hypothesis test on c which can be written $$|\hat{c}_{MV}|^2 = \frac{|(V^*U)U^*X - V^*X|^2}{(1-|U^*V|^2)} > ou < \mu'$$

where $\hat{c}_{MV}$ is the estimate of c within the meaning of the maximum likelihood of c.

In dual-sources, the proposed estimator consists of performing the following operations:

As illustrated in FIG. 3, from the calculation of the dual-source maximum likelihood estimator $\hat{S}_{MV}=(\hat{s},\hat{c})=(M^*M)^{-1}M^*X$ done in step 220, thresholding of the modulus of each component of $\hat{S}_{MV}$ is done in step 320 on each of the components $|\hat{s}_{MV}|$ and $|\hat{c}_{MV}|$.

Then, depending on the situation, spatial filtering is applied in steps 331 to 334 under the following conditions, which makes it possible to obtain the so-called Conditional Expectation with Independent Decisions (CEID) estimator:

If $|\hat{s}_{MV}|$>seuil and $|\hat{c}_{MV}|$>seuil: $\hat{S}_{ECDI}=(M^*M)^{-1}M^*X$ (step 331)

If $|\hat{s}_{MV}|$>seuil and $|\hat{c}_{MV}|$>seuil: $\hat{s}_{ECDI}=U^*X, \hat{c}_{ECDI}=0$ (step 332)

If $|\hat{s}_{MV}|$>seuil and $|\hat{c}_{MV}|$>seuil: $\hat{s}_{ECDI}=0, \hat{c}_{ECDI}=V^*X$ (step 333)

If $|\hat{s}_{MV}|$>seuil and $|\hat{c}_{MV}|$>seuil: $\hat{S}_{ECDI}=0$ (step 334)

In mono-source, the proposed estimator consists of performing the following operations, as illustrated in FIG. 2:

From the calculation of the dual-source maximum likelihood estimator $\hat{s}_{MV}=U^*X$ done in step 210, thresholding of the modulus of $\hat{s}_{MV}$ is done in step 350, then, depending on the situation, spatial filtering is applied in steps 361 or 362 under the following conditions:

If $|\hat{s}_{MV}|$>seuil: $\hat{s}_{ECDI}=U^*X$ (step 361)

If $|\hat{s}_{MV}|$<seuil: $\hat{s}_{ECDI}=0$ (step 362)

Advantageously, the threshold for steps 320, 350 is determined as follows:

Pfa refers to the probability of deciding $s \ne 0$ whereas $s=0$, and Pd is the probability of deciding $s \ne 0$ whereas $s \ne 0$.

For example and non-limitingly, it is proposed to use the Neyman-Pearson criterion, which consists of determining the Pfa (for example, several percent), and in return, maximizing Pd, which makes it possible to obtain a threshold on $\lambda'$ and $\mu'$. For example and non-limitingly, it is also possible to adjust the value of $\lambda'$ ($\mu'$, resp.) such that 1−Pd=Pfa around a set RSB.

A close alternative of the Maximum Likelihood called Thresholded Maximum Likelihood (TML) consists of performing the following operations:

Calculating the maximum likelihood estimator $\hat{S}_{MV}=(M^*M)^{-1}M^*X$

Thresholding the modulus of the components of $\hat{S}_{MV}$

Depending on the situation, applying spatial filtering

If $|\hat{s}_{MV}|$<seuil: $\hat{s}_{MVS}=0$, otherwise $\hat{s}_{MVS}=\hat{s}_{MV}$ If $|\hat{c}_{MV}|$<seuil: $\hat{c}_{MVS}=0$, otherwise $\hat{c}_{MVS}=\hat{c}_{MV}$ Another alternative consists of using one of the two previous estimators to obtain an initialization of the unknown parameters $q_{j,j=1\ldots 4}$, $\sigma_1^2$, $\sigma_2^2$, then applying the Conditional Expectation estimator or the Conditional Expectation with 4 Linear Filters estimator.

The invention claimed is:

1. A method for the non-linear estimation of wireless signals from several sources, the time/frequency representation of which shows an unknown non-zero proportion of zero components, comprising:
   using a listening system comprising an antenna array having P>2 antennas to receive a signal at each of the antennas that results from no more than two mixed signals from separate sources for which the directional vectors U and V of the sources emitting the no more than two mixed signals are known or estimated;
   transmitting the signal received at each of the antennas to a computing unit that is communicatively coupled to the antennas;
   calculating, by the computing unit, successive discrete Fourier transforms of the signals received by the antennas and sampled to obtain a time-frequency P-vector grid of the signals received by the antennas, each element of the time-frequency P-vector grid providing a time-frequency representation of the signals received by the antennas for a respective time interval and a respective frequency interval and being referred to as a box and containing a complex vector X forming a measurement; and for each box, calculating, from said box, by the computing unit, an estimation of a dual-source signal $S=(s, c)^T$, s being a time-frequency representation of the signals received by the antennas and associated with a first source and c being a time-frequency representation of the signals received by the antennas and associated with a second source and $(.)^T$ being the transpose of $(.)$, $\hat{S}=(\hat{s},\hat{c})^T$ based upon an approximation of a conditional expectation estimator of the signals s and c such that the estimation utilizes, as an a priori information, knowledge that the signals s and c have a non-zero proportion of components equal to zero estimate values of non-zero components of s and c, a probability density of S being modeled as a mixture of centered Gaussians weighted by coefficients $q_1$, $q_2$, $q_3$, $q_4$ representing probabilities of four respective situations in each box which are: (1) presence of the first and second sources, (2) presence of the first source and absence of the second source, (3) absence of the first source and presence of the second source, and (4) absence of the first and second sources, this approximation being:

$$\hat{S} = \frac{\sum_{j=1}^{4} q_j \det Q_j \det \Gamma_j \exp\left(\frac{X^* M Q_j M^* X}{2\sigma^2}\right) Q_j M^* X}{\sum_{j=1}^{4} q_j \det Q_j \det \Gamma_j \exp\left(\frac{X^* M Q_j M^* X}{2\sigma^2}\right)}$$

wherein $(.)^*$ is the conjugated transpose of the matrix $(.)$, $$Q_1 = \frac{1}{(1+\sigma^2/\sigma_1^2)(1+\sigma^2/\sigma_2^2) - |U^*V|^2}\begin{pmatrix} 1 & -U^*V \\ -V^*U & 1 \end{pmatrix}$$

$$Q_2 = \begin{pmatrix} 1/(1+\sigma^2/\sigma_1^2) & 0 \\ 0 & 0 \end{pmatrix}$$

$$Q_3 = \begin{pmatrix} 0 & 0 \\ 0 & 1/(1+\sigma^2/\sigma_2^2) \end{pmatrix}$$

$$Q_4 = \begin{pmatrix} 0 & 0 \\ 0 & 0 \end{pmatrix};$$

wherein $\det Q_1 \det \Gamma_1$, $\det Q_2 \det \Gamma_2$, $\det Q_3 \det \Gamma_3$, and $\det Q_4 \det \Gamma_4$ are respectively equal to: $(1-|U^*V|^2)^{-1}$ $\sigma^4/\sigma_1^2\sigma_2^2$, $\sigma^2/\sigma_1^2$, $\sigma^2/\sigma_2^2$, and 1;

wherein $2\sigma_1^2$, $2\sigma_2^2$ are respectively power of the signal s associated with the first source and power of the signal c associated with the second source;

wherein $2\sigma^2$ is power of noise presumed Gaussian, spatially, frequentially, and temporally white; and wherein $M=(U\ V)$.

2. The method according to claim 1, further comprising estimating parameters $(q_j,\sigma_1^2,\sigma_2^2)$ necessary to establish the conditional expectation using a method of moments operating on the boxes of a divided window in the time-frequency P-vector grid.

3. The method according to claim 1, wherein the computing unit is included in a radar receiver system.

4. The method according to claim 1, further comprising performing, by the computing unit, identification of the sources as a function of the estimated signals s and c.

5. The method according to claim 1, wherein the conditional expectation estimator is approximated by a processing called "conditional expectation with four linear filters" (CE4LF) including a four-hypothesis decision processing pertaining to four Hermitian forms of the measurement X, followed by linear filtering commanded by a result of the four-hypothesis decision according to equations:

$$\hat{S} = Q_{j_0} M^* X \text{ wherein } j_0 = \underset{j}{\text{ArgMax}}\{\ln(q_j \det Q_j \det \Gamma_j) + X^* M Q_j M^* X / 2\sigma^2\} j \in \{1, 2, 3, 4\}.$$

6. The method according to claim 5, wherein the CE4LF is approximated by a processing called "conditional expectation with independent decisions" (CEID) obtained by two statistical tests with two hypotheses followed by linear filtering commanded by a result of the two statistical tests.

7. The method according to claim 6, wherein a decision threshold used in the CEID is chosen with respect to a probability of a false alarm that corresponds to a probability of declaring the signals s and c to be non-zero when it is zero.

8. The method according to claim 6, wherein said method includes:
  a first estimate of the signals s and c that is obtained using the CEID or a thresholded maximum likelihood method,
  an estimate of parameters $(q_j,\sigma_1^2,\sigma_2^2)$ that is obtained from the said first estimate of the signals s and c, and
  a second estimate of the signals s and c that is obtained using the CEID method or the CE4LF method, informed by the values of the said estimate of parameters $(q_j,\sigma_1^2,\sigma_2^2)$.

9. The method according to claim 6, wherein the four-hypothesis decision is given by:
  if $|\hat{s}_{MV}|$>threshold and $|\hat{c}_{MV}|$>threshold: the first and second sources are present;
  if $|\hat{s}_{MV}|$>threshold and $|\hat{c}_{MV}|$<threshold: the first source is present and the second source is absent;
  if $|\hat{s}_{MV}|$<threshold and $|\hat{c}_{MV}|$>threshold: the first source is absent and the second source is present; and
  if $|\hat{s}_{MV}|$<threshold and $|\hat{c}_{MV}|$<threshold: the first and second sources are absent;
  wherein $\hat{S}_{MV}=(\hat{s}_{MV}\ \hat{c}_{MV})^T$ is a dual-source maximum likelihood estimator $\hat{S}_{MV}=(M^*M)^{-1}M^*X$.

10. The method according to claim 9, wherein said method includes:
  a first estimate of the signals s and c that is obtained using the CEID or a thresholded maximum likelihood method,
  an estimate of parameters $(q_j,\sigma_1^2,\sigma_2^2)$ done from the said first estimate of the signals s and c, and
  a second estimate of the signals s and c that is obtained using the CEID method or the CE4LF method, informed by the values of the said estimate of parameters $(q_j,\sigma_1^2,\sigma_2^2)$.

11. The method according to claim 10 wherein, as a function of the result of the four-hypothesis decision, linear filtering provides for an "independent decision conditional expectation" estimator, which is $\hat{S}_{ECDI}=(\hat{s}_{ECDI}\ \hat{c}_{ECDI})^T$:

if the first and second sources are present: the dual-source maximum likelihood estimator for the signals s and c: $\hat{S}_{ECDI}=(M*M)^{-1}M*X$;

if the first source is present and the second source is absent: a mono-source maximum likelihood estimator for s, and 0 for c: $\hat{s}_{ECDI}=U*X$, $\hat{c}_{ECDI}=0$;

if the first source is absent and the second source is present: 0 for s, and a mono-source maximum likelihood estimator for c: $\hat{s}_{ECDI}=0$, $\hat{c}_{ECDI}=V*X$; and if the first and second sources are absent: 0 for the signal of the first and second sources: $\hat{S}_{ECDI}=0$.

12. The method according to claim 11, wherein said method includes:

a first estimate of the signals s and c that is obtained using the CEID or a thresholded maximum likelihood method, an estimate of parameters $(q_j, \sigma_1^2, \sigma_2^2)$ done from the said first estimate of the signals s, c, and a second estimate of the signals s and c that is obtained using the CEID method or the CE4LF method, informed by the values of the said estimate of parameters $(q_j, \sigma_1^2, \sigma_2^2)$.

13. The method according to claim 11, wherein, an approximation of the CEID is calculated by a thresholded maximum likelihood $\hat{S}_{MVS}=(\hat{s}_{MVS}\ \hat{c}_{MVS})^T$ obtained by estimating the signal(s) using the dual-source maximum likelihood estimator followed by a comparison of each estimate to a threshold, according to the equations:

if $|\hat{s}_{MV}|<$threshold: $\hat{s}_{MVS}=0$, else $\hat{s}_{MVS}=\hat{s}_{MV}$ if $|\hat{c}_{MV}|<$threshold: $\hat{c}_{MVS}=0$, else $\hat{c}_{MVS}=\hat{c}_{MV}$.

\* \* \* \* \*